(12) United States Patent
Elmer et al.

(10) Patent No.: US 6,472,316 B1
(45) Date of Patent: Oct. 29, 2002

(54) PHOTOLITHOGRAPHY OVERLAY CONTROL

(75) Inventors: James R. B. Elmer, Vancouver, WA (US); Eric J. Kirchner, Troutdale, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/971,329

(22) Filed: Oct. 4, 2001

(51) Int. Cl.[7] ........................................... H01L 21/4763
(52) U.S. Cl. ...................................... 438/637; 438/618
(58) Field of Search ........................... 438/13, 14, 618, 438/633, 637, 685, 922, 692

(56) References Cited

U.S. PATENT DOCUMENTS 5,470,792 A * 11/1995 Yamada
5,899,738 A * 5/1999 Wu et al.
2001/0036726 A1 * 11/2001 Yokoi

* cited by examiner

Primary Examiner—David Nelms
Assistant Examiner—Phuc T. Dang
(74) Attorney, Agent, or Firm—Luedeka, Neely & Graham, P.C.

(57) ABSTRACT

A method for forming an alignment feature on a substrate. The alignment feature is of the type concurrently formed with an electrically conductive layer overlying an electrically nonconductive layer having vias. The vias are filled with an electrically conductive material, and the alignment feature has a smaller aspect ratio than the vias. The alignment feature is not filled with the electrically conductive material when a first amount of the electrically conductive material, sufficient to just fill the vias, is deposited on the substrate. The first amount of the electrically conductive material within the alignment feature is not sufficient to prevent the alignment feature in the electrically conductive layer from distorting, and thereby reducing the effectiveness of the alignment feature. The improvement is in depositing an additional amount of the electrically conductive material on the substrate. The additional amount is more than the first amount that is just sufficient to fill the vias, and fills the alignment feature to a level sufficient to prevent the alignment feature in the electrically conductive layer from distorting and reducing the effectiveness of the alignment feature.

20 Claims, 1 Drawing Sheet

PHOTOLITHOGRAPHY OVERLAY CONTROL

FIELD

This invention relates to the manufacture of integrated circuits. More particularly, the invention relates to improving the alignment of images between the various layers applied to the integrated circuits.

BACKGROUND

The manufacture of integrated circuits, such as semiconductor devices, may generally be characterized as a series of photolithography steps, where in each step a photoresist layer is applied to a substrate, images are transferred to the photoresist layer as by passing a light beam through a projection mask, the photoresist layer is developed, portions of the photoresist layer are thereby removed, and the underlying layers are processed, such as by an etching step.

It is desirable to align the various images of each layer one to another. To this end, alignment features are typically formed, such as by etching an alignment pattern in the various layers of the substrate, or by depositing material with such alignment patterns. However, conventional manufacturing techniques tend to degrade the alignment features as processing proceeds from layer to layer. For example, a layer deposited in an alignment feature after a via fill step may tend to form patterns in and around the alignment feature to such a degree that the geometry of the alignment feature becomes difficult to see with the desired precision.

As the geometries of integrated circuits continues to shrink, the errors that are introduced by such alignment problems tend to have a greater effect on the performance of the integrated circuits. For example, with smaller structures created in the integrated circuits, an alignment shift of a tenth of a micron or so, which may have been acceptable in an integrated circuit with large features, is not tolerable in an integrated circuit with small features.

What is needed, therefore, is a system for more precisely aligning layers one to another.

SUMMARY

The above and other needs are met by a method for forming an alignment feature on a substrate. The alignment feature is of the type concurrently formed with an electrically conductive layer overlying an electrically nonconductive layer having vias. The vias are filled with an electrically conductive material, and the alignment feature has a smaller aspect ratio than the vias. The alignment feature is not filled with the electrically conductive material when a first amount of the electrically conductive material, sufficient to just fill the vias, is deposited on the substrate. The first amount of the electrically conductive material within the alignment feature is not sufficient to prevent the alignment feature in the electrically conductive layer from distorting, and thereby reducing the effectiveness of the alignment feature.

The improvement is in depositing an additional amount of the electrically conductive material on the substrate. The additional amount is more than the first amount that is just sufficient to fill the vias, and fills the alignment feature to a level sufficient to prevent the alignment feature in the electrically conductive layer from distorting and reducing the effectiveness of the alignment feature.

In various preferred embodiments, the substrate is silicon, the electrically nonconductive layer is silicon oxide, the electrically conductive material is tungsten, and the electrically conductive layer is either aluminum or copper. According to another aspect of the invention there is provided an integrated circuit having an alignment feature formed according to the method described above.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
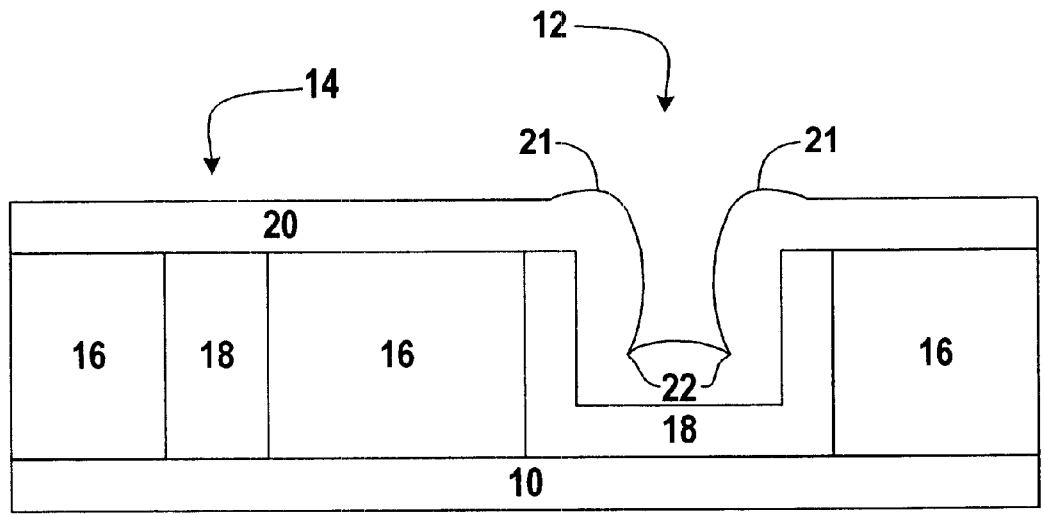
FIG. 1 is a cross sectional view of a prior art layer where the geometry of an alignment feature is distorted.

The invention advantageously enables the formation of alignment features having improved geometry as compared to conventional alignment features. With reference to FIG. 1, there is represented a substrate 10 having structures such as an alignment feature 12 and a via 14 etched in a first layer 16, which is preferably an electrically nonconductive layer 16. A second layer 18, which is preferably an electrically conductive material 18 is applied to the substrate 10 and polished to the level of the upper surface of the substrate 10, which in the example as depicted in FIG. 1 is the top surface of the electrically nonconductive layer 16. A third layer 20, which is preferably an electrically conductive layer 20 such as aluminum, copper, or a composite of several layers of various metallic materials, is applied across the surface of the substrate 10, which in the example as depicted in FIG. 1 is the electrically nonconductive layer 16 and the electrically conductive material 18.

As used herein, the term "substrate" refers not only to the base layer 10 of the structures that are formed, but also to the entirety of the structures as a succeeding layer is deposited. The exact meaning of the term in any given instance is easily discerned from the context of its usage and with reference to the figures.

The layers and processing as described above are typical to integrated circuit manufacturing, such as semiconductor device manufacturing on wafers. For example, in a specific embodiment of the example presented above, the substrate 10 is a silicon substrate 10, the electrically nonconductive layer 16 is a dielectric layer such as a layer of silicon dioxide or low k material, the electrically conductive material 18 is a contact layer, such as tungsten, which is used to make electrical contact to the underlying silicon substrate 10, and the electrically conductive layer 20 is a metal layer 20 used for making electrically conductive interconnections between various features in the integrated circuit, such as through the via 14.

Subsequent processing typically includes patterning the electrically conductive layer 20 and the application of additional layers having features, including alignment features. The mask for patterning the electrically conductive layer 20, and the alignment features of the subsequent layers are desirably aligned with the alignment feature 12.

However, in a conventional manufacturing process, as represented in FIG. 1, the application of the electrically conductive layer 20 has distorted the geometry of the alignment feature 12. As seen in FIG. 1, this is typically manifest such as by excess deposits 21 of the electrically conductive layer 20 near the top corners of the alignment feature 12, typically called bread loaves, and a rounding of the electrically conductive layer 20 at the bottom of the alignment feature 12 that forms sharp corners 22, typically called cusps. Distortions in the geometry of the alignment feature 12 undesirably reduce the effectiveness of the alignment feature 12, and the ability to align subsequently formed mask layers and alignment features with the alignment feature 12.

In the conventional process depicted in FIG. 1, the electrically conductive material 18 is deposited in an amount sufficient to fill the via 14, but not the alignment feature 12. As is seen in FIG. 1, the electrically conductive material 18 is typically deposited in a process whereby a highly conformal layer is formed. This is highly desirable so as to completely fill the via 14 without leaving any voids in the via 14. As can be seen, by time an amount of the electrically conductive material 18 has been deposited which is sufficient to fill the via 14, the alignment feature 12 is not filled, and is only coated with a layer of the electrically conductive material 18 that is relatively thin as compared to the size of the alignment feature 12. Thus, this difference between the aspect ratio of the via 14, which is relatively high, and the aspect ratio of the alignment feature 12, which is relatively low, tends to be the source of the problem as discussed above.

The invention advantageously avoids undesirable alignment feature 12 geometries such as the distortions 21 and 22. Accordingly, and with reference to FIG. 2, there is depicted a substrate 10 having an alignment feature 12 in accordance with a preferred embodiment of the invention. The substrate 10 includes a via 14 etched in the electrically nonconductive layer 16. The substrate 10 is preferably processed in accordance with the invention by deposition of an electrically conductive material 18 in an amount significantly greater than the amount deposited in the prior art process of FIG. 1.

In a preferred embodiment, the electrically conductive material 18 is deposited to a thickness that is no more than about that which is required to fill the alignment feature 12. This thickness is considered to be an absolute maximum amount, as it is desirable to not planarize the alignment feature 12 by completely filling it with a large amount of the electrically conductive material 18, but rather to fill the alignment feature 12 with an amount of the electrically conductive material 18 that is sufficient to overcome in substantial measure the distortions 21 and 22 as described above, but to still leave geographical features in the overlying electrically conductive layer 20, to which the mask for patterning the electrically conductive layer 20 and subsequent layers may be aligned.

Thus, the exact additional thickness 24 of the electrically conductive material 18 to be deposited according to the present invention is preferably dependent at least in part on considerations such as the aspect ratio of the via 14, which is related to the amount of the electrically conductive material 18 that is typically deposited, and the aspect ratio of the alignment feature 12, which is related to the amount 24 of the electrically conductive material 18 that is preferably additionally deposited according to the present invention. Further considerations in regard to the selection of the proper additional amount 24 of the electrically conductive material 18 to deposit include the geometry of the electrically conductive layer 20 that may be desired for aligning the mask work for the electrically conductive layer 20.

Figure 2:
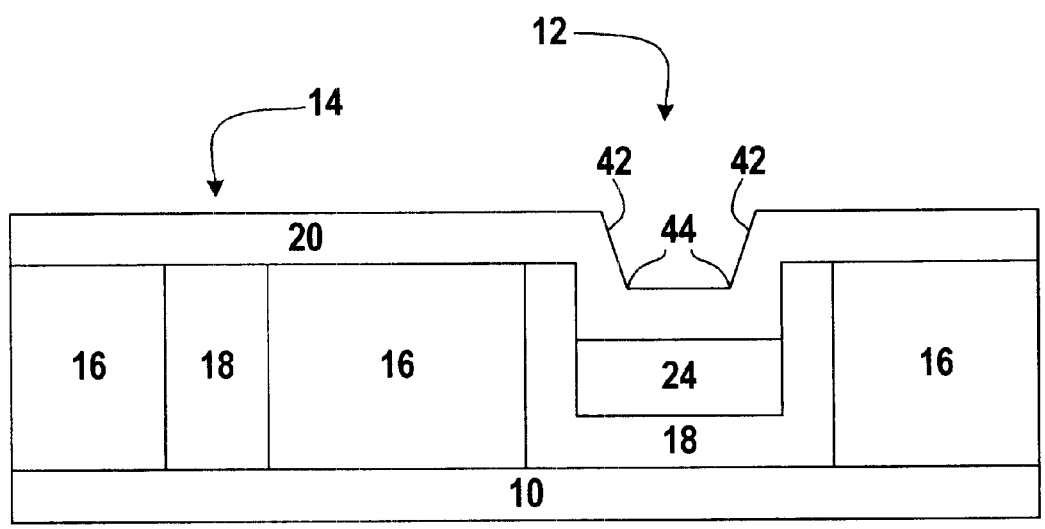
FIG. 2 is a cross sectional view of a layer according to a preferred embodiment of the present invention, where the geometry of the alignment feature is not distorted.

In this regard, an additional amount 24 of the electrically conductive material 18 is deposited within the alignment feature 12. The additional amount 24 may be deposited just within the alignment feature 12, or more preferably across the entire surface of the substrate 10, so as to make the step of such additional deposit easier. Further, the additional amount 24 may be deposited in a highly conformal manner, where the thickness of the electrically conductive material 18 tends to build up on the side walls of the alignment feature 12 at substantially the same rate that it builds up on the bottom of the alignment feature 12, or the additional amount 24 may be deposited in a highly directional manner, such as depicted in FIG. 2, where the additional thickness 24 of the electrically conductive material 18 tends to build up substantially exclusively on the bottom of the alignment feature 12, with a relatively insignificant amount of the additional thickness 24 of the electrically conductive material 18 building up on the side walls of the alignment feature 12. The selection of which of these various processes to choose is preferably based at least in part on the geometry desired for alignment feature 12.

Most preferably, the additional amount 24 of the electrically conductive material 18 is deposited prior to the planarization step, so that any amount of the additional amount 24 of the electrically conductive material 18 that is deposited on the upper surfaces of the electrically nonconductive layer 16 is planarized according to a desired process, such as complete removal of such to the level of the upper surface of the electrically nonconductive layer 16.

The electrically conductive layer 20 is deposited onto the substrate 10 as in prior processing, such as that described above. As seen in FIG. 2, the application of the additional amount 24 of the electrically conductive material 18 enables the electrically conductive layer 20 to have a profile that is substantially free from the undesirable distortions 21 and 22 described in connection with FIG. 1. This profile is characterized by relatively planar surfaces 42 and angles 44 that do not fold back toward adjacent surfaces. Alignment features 12 with profiles such as depicted in FIG. 2 tend to be easier to align to than those with profiles such as depicted in FIG. 1.

Thus, integrated circuits, such as semiconductor devices, processed in accordance with the methods as described above tend to have better alignment of layers, one to another, and thus also tend to function in a manner that is closer to the design specifications for the integrated circuit.

It is appreciated that the materials as described above, while providing an especially preferred application of the invention, are by way of example only, and that other materials that are compatible with the materials, structures, and processes of integrated circuit processing are also generally applicable to the invention as disclosed herein.

The foregoing embodiments of this invention have been presented for purposes of illustration and description. They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. In a method for forming an alignment feature on a substrate, where the alignment feature is of the type concurrently formed with an electrically conductive layer overlying an electrically nonconductive layer having vias, where the vias are filled with an electrically conductive material, and the alignment feature has a smaller aspect ratio than the vias, and the alignment feature is not filled with the electrically conductive material when a first amount of the electrically conductive material sufficient to just fill the vias is deposited on the substrate, and the first amount of the electrically conductive material within the alignment feature is not sufficient to prevent the alignment feature in the electrically conductive layer from distorting and thereby reducing the effectiveness of the alignment feature, the improvement comprising depositing an additional amount of the electrically conductive material on the substrate, which additional amount is more than the first amount just sufficient to fill the vias, and which additional amount fills the alignment feature to a level sufficient to prevent the alignment feature in the electrically conductive layer from distorting and reducing the effectiveness of the alignment feature.

2. The method of claim 1, wherein the substrate comprises silicon.

3. The method of claim 1, wherein the electrically nonconductive layer comprises silicon oxide.

4. The method of claim 1, wherein the electrically conductive material comprises tungsten.

5. The method of claim 1, wherein the electrically conductive layer comprises aluminum.

6. The method of claim 1, wherein the electrically conductive layer comprises copper.

7. An integrated circuit, the improvement comprising an alignment feature formed according to the method of claim 1.

8. In an alignment feature on a substrate, where the alignment feature is of the type concurrently formed with an electrically conductive layer overlying an electrically nonconductive layer having vias, where the vias are filled with an electrically conductive material, and the alignment feature has a smaller aspect ratio than the vias, and the alignment feature is not filled with the electrically conductive material when a first amount of the electrically conductive material sufficient to just fill the vias is deposited on the substrate, and the first amount of the electrically conductive material within the alignment feature is not sufficient to prevent the alignment feature in the electrically conductive layer from distorting and thereby reducing the effectiveness of the alignment feature, the improvement comprising an additional amount of the electrically conductive material on the substrate, which additional amount is more than the first amount just sufficient to fill the vias, and which additional amount fills the alignment feature to a level sufficient to prevent the alignment feature in the electrically conductive layer from distorting and reducing the effectiveness of the alignment feature.

9. The alignment feature of claim 8, wherein the substrate comprises silicon.

10. The alignment feature of claim 8, wherein the electrically nonconductive layer comprises silicon oxide.

11. The alignment feature of claim 8, wherein the electrically conductive material comprises tungsten.

12. The alignment feature of claim 8, wherein the electrically conductive layer comprises aluminum.

13. The alignment feature of claim 8, wherein the electrically conductive layer comprises copper.

14. An integrated circuit, the improvement comprising the alignment feature according to claim 8.

15. A method for processing a layer on a substrate, the layer having an alignment feature and a via, the method comprising the steps of:

applying tungsten on the substrate in an amount substantially greater than that necessary to fill the via and no more than that necessary to fill the alignment feature, removing the tungsten from an upper surface of the substrate while retaining the tungsten in the via and the alignment feature, and depositing metal on the substrate, including over the via and the alignment feature, where the metal over the alignment feature has a profile that is substantially free from distortions.

16. The method of claim 15, wherein the substrate comprises silicon.

17. The method of claim 15, wherein the layer comprises silicon oxide.

18. The method of claim 15, wherein the metal comprises aluminum.

19. The method of claim 15, wherein the metal comprises copper.

20. An integrated circuit, the improvement comprising a layer processed according to the method of claim 15.

* * * * *